(12) United States Patent
Zißler et al.

(10) Patent No.: US 12,013,454 B2
(45) Date of Patent: Jun. 18, 2024

(54) BROAD BAND COAXIAL LOAD

(71) Applicant: SPINNER GmbH, Munich (DE)

(72) Inventors: Wolfgang Zißler, Feldkirchen Westerham (DE); Janno Zovo, Munich (DE); Andreas Grabichler, Bruckmühl (DE); Hans-Ulrich Nickel, Neubiberg (DE); Rupert Huber, Schechen (DE)

(73) Assignee: SPINNER GMBH (DE)

( * ) Notice: Subject to any disclaimer, the term of this patent is extended or adjusted under 35 U.S.C. 154(b) by 0 days.

(21) Appl. No.: 18/231,463

(22) Filed: Aug. 8, 2023

(65) Prior Publication Data
US 2023/0408618 A1    Dec. 21, 2023

Related U.S. Application Data

(63) Continuation of application No. PCT/EP2022/083561, filed on Nov. 29, 2022.

(30) Foreign Application Priority Data

Dec. 23, 2021 (EP) ..................................... 21217317

(51) Int. Cl.
| | |
|---|---|
| *G01R 35/00* | (2006.01) |
| *G01R 27/28* | (2006.01) |
| *H01B 1/02* | (2006.01) |
| *H01B 5/02* | (2006.01) |

(52) U.S. Cl.
CPC ........... *G01R 35/007* (2013.01); *G01R 27/28* (2013.01); *H01B 1/02* (2013.01); *H01B 5/02* (2013.01)

(58) Field of Classification Search
CPC ........ G01R 35/007; G01R 27/28; H01B 1/02; H01B 5/02
See application file for complete search history.

(56) References Cited

U.S. PATENT DOCUMENTS

| | | | |
|---|---|---|---|
| 6,084,485 A * | 7/2000 | Bickford | H01P 5/10 |
| | | | 343/859 |
| 6,407,542 B1 | 6/2002 | Conte | |
| 9,423,481 B2 | 8/2016 | Hechtfischer et al. | |
| 2005/0190527 A1* | 9/2005 | Stevenson | A61N 1/3754 |
| | | | 361/302 |

(Continued)

FOREIGN PATENT DOCUMENTS

| | | |
|---|---|---|
| CH | 708512 A2 | 3/2015 |
| CN | 1535493 A | 10/2004 |

(Continued)

OTHER PUBLICATIONS

PCT International Search Report and Written Opinion, PCT/EP2022/083561, Mar. 14, 2023, 14 pages.

(Continued)

*Primary Examiner* — Akm Zakaria
(74) *Attorney, Agent, or Firm* — Quarles & Brady LLP; Yakov S. Sidorin

(57) ABSTRACT

A broad band coaxial load includes a conductive rod that is held coaxially within a coaxial support. The coaxial support includes a body containing a round hole with three axial sections (that include an exponential funnel), a plurality of radially oriented contact springs, and a cylindrical hole geometrically/dimensionally matching to the diameter of the conductive rod.

19 Claims, 7 Drawing Sheets

(56) References Cited

U.S. PATENT DOCUMENTS

| | | | |
|---|---|---|---|
| 2007/0218755 A1 | 9/2007 | Weiss et al. | |
| 2013/0221984 A1* | 8/2013 | Hechtfischer | G01R 35/005 |
| | | | 156/267 |
| 2020/0243991 A1* | 7/2020 | Weidenspointner | H01R 12/52 |
| 2021/0257794 A1* | 8/2021 | Halbig | H01R 13/432 |

FOREIGN PATENT DOCUMENTS

| | | |
|---|---|---|
| CN | 201555942 U | 8/2010 |
| CN | 106654489 A | 5/2017 |
| CN | 106970344 A | 7/2017 |
| CN | 208401011 U | 1/2019 |
| CN | 111164838 A | 5/2020 |
| CN | 212810509 U | 3/2021 |
| DE | 2042821 A1 | 3/1972 |
| JP | S6177402 A | 4/1986 |
| JP | H03105264 A | 5/1991 |
| JP | H0548307 A | 2/1993 |

OTHER PUBLICATIONS

The State Intellectual Property Office of People's Republic of China, First Office Action and Search Report, Application No. 202280016324.7, Dec. 4, 2023, 10 pages.

Japan Patent Office, Notification of Reasons for Refusal, Application No. 2023-554341, Feb. 7, 2024, 6 pages.

* cited by examiner

BROAD BAND COAXIAL LOAD

CROSS-REFERENCE TO RELATED APPLICATIONS

This application is a continuation of pending International Application No. PCT/EP2022/083561 filed on Nov. 29, 2022 and now published as WO 2023/117321 A1, which designates the United States and claims priority from the European Application No. 21217317.3 filed on Dec. 23, 2021. The disclosure of each of the above-identified patent applications is incorporated herein by reference.

BACKGROUND

1. Field of the Invention

The invention relates to broad band coaxial load for RF signals. The load may be used as a calibration device for RF measurement equipment like a network analyzer.

2. Description of Related Art

Network analyzers normally are calibrated by calibration standards. The precision of a calibration is largely dependent on the precision of the calibration standards used. Therefore, calibration standards are required, which provide specific characteristics over a broad bandwidth. Most calibration methods use through connection, open, short and a load. A calibration load must have a constant impedance over a specified frequency range resulting in a high return loss.

A coaxial load is disclosed in DE 2042821. Here, a rod of conductive material is held within a tapered outer conductor. A calibration load disclosed in U.S. Pat. No. 9,423,481 B2 is based on the same basic concept. Here, in addition, the inner conductor is suspended flexible to compensate for mechanical tolerances of an external connector mated with the calibration load. Generally, a flexing of the center conductor out of its precise center position is an asymmetry which affects impedance matching and therefore return loss specifically at higher frequencies.

SUMMARY

The problem to be solved by the invention is to provide a broad band coaxial load which may be used for frequencies up to 150 GHz and more. The load should be easy and cost efficient to manufacture. It should have a high return loss over a wide bandwidth together with excellent long-term characteristics.

A broad band coaxial load is based on a conductive rod which is held coaxially within an outer conductor transition element, which is mentioned herein as a coaxial support. The coaxial support may have a body with a round or circular hole having at least three different sections.

The body itself may include a polymer or plastic material with a metallic surface. Such a metallic surface may be configured as a thin metallic film generated by sputtering, anodizing or any other suitable process. The metallic surface should be at least in the region of the hole, such that the inner side of the hole has a conductive surface. It is not necessary to provide a complete metallic surface at the whole body.

The conductive body may be manufactured by an additive manufacturing method. Such additive manufacturing methods may include stereolithography or Photopolymerization, e.g., two-photon-lithography, two-photon-polymerization, multi-photon-polymerization. This allows an extreme miniaturization, because it is very difficult to machine a precise contour of the hole. Further, all components like springs which will be explained later in detail may be manufactured from one piece which results in increased stability and durability. Finally, this manufacturing method allows an extreme flexibility and scalability, such that the body may be adapted to a large scale of conductive rods and frequency ranges.

The coaxial support includes at least three sections which at least differ in the shape of the hole.

A first section, which is starting from a first side of a coaxial support includes an exponential funnel. This funnel has a first larger diameter which may be adapted to a coaxial system which may be connected to a first side of the coaxial support and will be discussed later. The opening of the funnel decreases to a second diameter which is within the body, and which may numerically substantially match to the diameter of the conductive rod. While generally the funnel may also have a linear or straight internal slope between the first diameter and the second diameter, but a higher return loss of a load may be achieved by using a slope the shape of which follows an exponential function.

The funnel may include at least one of a linear funnel (a funnel having a substantially conical shape), a curved funnel (a funnel an axial cross-section of which is bound by a curved line), a circular funnel (a funnel with a circular cross section defined across the axis of the funnel), a hyperbolic funnel (a funnel having an axial cross-section bound by a curve that is substantially a hyperbola), and an exponential funnel (a funnel having an axial cross-section bound by a substantially exponential curve). In at least one case, the funnel may be rotationally symmetric about its center axis. It may have in a sectional view (containing the funnel axis), a linear, a curved, a circular, a hyperbolic, or an exponential shape.

After the funnel, a second section follows, which is a contacting section, and which may be configured to contact the conductive rod. The second section may include a plurality of radially oriented contact springs. These contact springs generate a radial force to the conductive rod in order to electrically contact the conductive rod and to provide a comparatively short current path to the interior of the hole. The spring section (as a plurality of contact springs) may have a diameter which may be geometrically matched to the diameter of the conductive rod. Besides providing an electrical contact, the spring section provides at least some mechanical friction to the conductive rod and therefore may hold the conductive rod in its position within the body.

A third section following the second section includes a cylindrical hole which has a diameter matching to the diameter of the conductive rod. This third section provides a precise guidance of the conductive rod, such that the conductive rod is stabilized in an axial orientation of the body. The rod may only be moved in an axial direction through the body. As the rod may include a comparatively stiff material, e.g., glass or metal as will be explained later in detail, the rod keeps a comparatively fixed position within the funnel of a first section due to the guidance of the third section. This is important as radial deviations in the position of the rod against the exponential funnel would change the impedance of the coaxial load and therefore reduce the return losses of the coaxial load.

The hole through all sections may be a through hole.

The conductive rod must be adapted to the characteristic impedance of the coaxial system of the broad band coaxial load. It may include in an axial direction between a first end and an opposing second end multiple sections with different properties. There may be a first high conductive zone at the first end. This high conductive zone may be used to contact a coaxial conductor system like a center conductor. Next to this high conductive zone is at least a first resistive zone which may have a constant or a varying resistance over its length. After this first resistive zone, there may be a second resistive zone which may have a different resistance. Finally, there may be a further low impedance conductive zone, which may be used to be contacted with the contact springs of the coaxial support. The conductive and/or resistive zones are connected to neighboring zones.

The conductive rod may include a dielectric rod body, e.g., a glass rod body or glass fiber rod body that may be complemented with a conductive surface. Specifically, from telecommunication applications, glass fibers can be manufactured with a very high precision. This is important, because variations in thickness or diameter of the conductive rod vary the impedance and affect the return loss characteristics. Such a glass fiber, herein also named as a glass rod, may receive a conductive surface by sputtering or any other suitable method like anodizing. It may also be possible to combine different technologies like anodizing and sputtering. Further, thin metal rings may be used to provide the low impedance sections.

When assembled, the conductive rod may protrude from the second side of the coaxial support. This may allow gripping the end of the conductive rod and to move it in an axial direction of the hole for precise adjustment. In a further embodiment, the end of the conductive rod may be glued to the second side of the coaxial support. This may allow a good fixation providing a long-lasting precise characteristic. Due to the force applied by the second section, this may not be necessary, but it may be used to improve quality.

In an embodiment, the coaxial support together with the conductive rod may be held by a shell. There may further be a coaxial outer conductor holding a coaxial center conductor, which both may be made of metal or of a material having at least a conductive surface. The coaxial center conductor may be connected to the conductive rod and the coaxial outer conductor may be in electrical and mechanical contact to the first side of the coaxial support. Further, the first diameter of the exponential funnel may have the same diameter as the inner diameter of the outer conductor.

There may be provided a further housing to increase stability and to improve the handling characteristics, as for high frequencies, the coaxial support is comparatively small and can barely be handled with bare hands. The housing may enclose a hollow space at the second side of the coaxial support. This hollow space prevents any object touching the conductive rod at the second side of the coaxial support and therefore changing adjustment.

If and when the contact springs are configured to be monolithic with the coaxial support, they have a comparatively high stability and a common surface, which allows a conductive surface coating without interruptions. The contact springs together with the contact protrusions are arranged radially and they may be at the same axial distance to provide the same electrical length from the beginning of the conductive rod to each of the contact points. There exist at least three contact springs which may be evenly angularly spaced. In an embodiment, six contact springs are provided even a higher number of contact springs depending on the possible degree of miniaturization may be used.

In an embodiment, the conductive rod has a low impedance surface over its length or includes a metallic material. Such an embodiment would be a short-circuit which may also be used for calibration.

In an embodiment, the conductive rod may be printed of an absorbing material, e.g., carbonyl iron.

BRIEF DESCRIPTION OF THE DRAWINGS

In the following, the invention will be described by way of example, without limitation of the general inventive concept, on examples of embodiment and with reference to the drawings.

DETAILED DESCRIPTION

Figure 1:
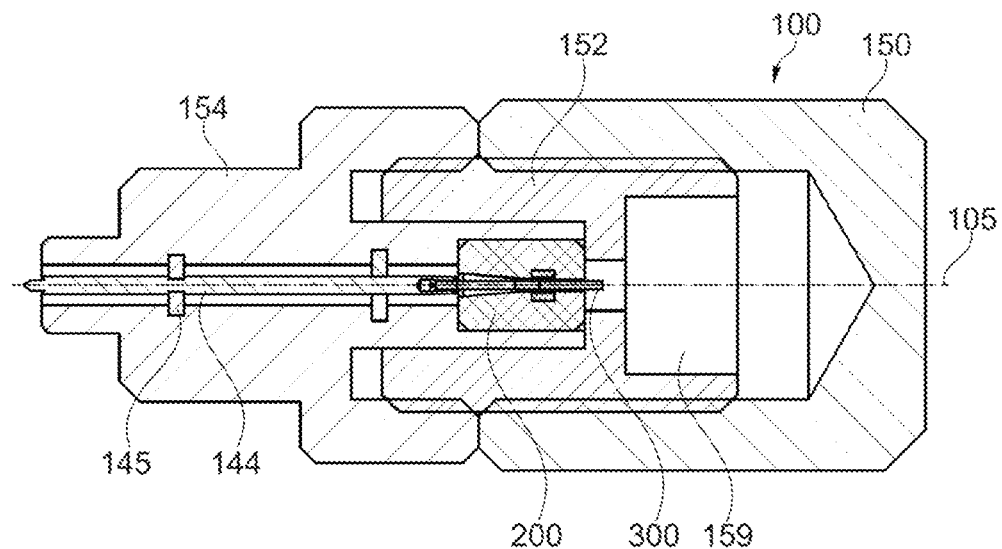
FIG. 1 is a sectional view of an embodiment.

Generally, the drawings are not to scale. Like elements and components are referred to by like labels and numerals. For the simplicity of illustrations, not all elements and components depicted and labeled in one drawing are necessarily labels in another drawing even if these elements and components appear in such other drawing.

While various modifications and alternative forms, of implementation of the idea of the invention are within the scope of the invention, specific embodiments thereof are shown by way of example in the drawings and are described below in detail. It should be understood, however, that the drawings and related detailed description are not intended to limit the implementation of the idea of the invention to the particular form disclosed in this application, but on the contrary, the intention is to cover all modifications, equivalents and alternatives falling within the spirit and scope of the present invention as defined by the appended claims.

In FIG. 1, a sectional view of an embodiment is shown. A coaxial support 200 holds a conductive rod 300 coaxially and centered to its center axis 105. The coaxial support 200 may be held in between a shell 152 and an outer conductor 154. The outer conductor 154 may further hold a center conductor 144 by means of spacers 145. The center conductor 144 is in electrical contact with the conductive rod 300. A load housing 150 may be provided to protect the interior components and to increase the size of the device to improve handling by bare hands. Further, the load housing 150 may enclose a hollow space 159 behind the coaxial support 200.

Figure 2:
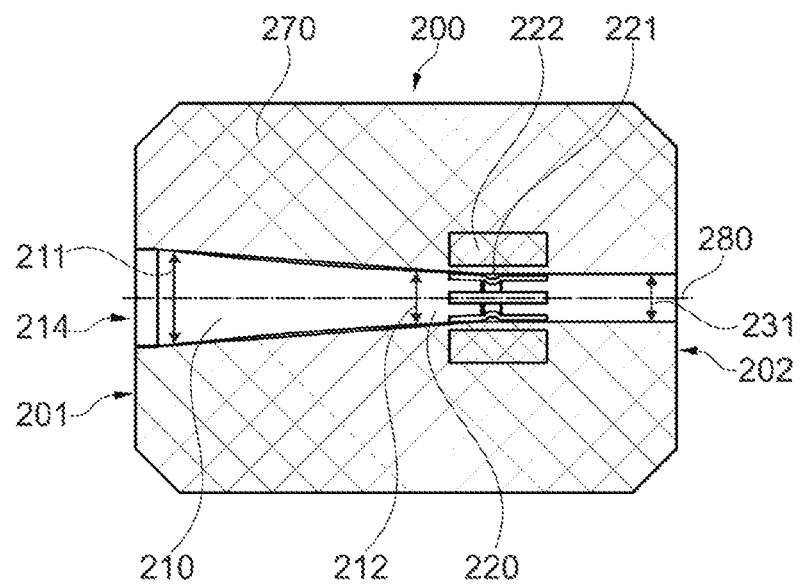
FIG. 2 shows a coaxial support in detail.

In FIG. 2, a coaxial support 200 is shown in more detail. The coaxial support 200 includes a body 270. The body may include a polymer material which may have been manufactured by an additive manufacturing process. Such additive manufacturing processes result in a large flexibility to modify the size and structure adapting to specific requirements. The body 270 includes a circular or round hole (that is, a hole or hollow having a substantially circular cross-section) with at least three axial sections. The hole may have a conductive inner surface configured as a thin metallic film by sputtering or anodizing or any other suitable method, and/or represented by a thin metallic sheet. The first axial section 210 of the hole includes an exponential funnel 214. This funnel has a first diameter 211 at a first side 201 of the body 270. The diameter of the funnel decreases towards inside of the body to a second diameter 212. The second diameter 212 may be adapted to the diameter of the conductive rod whereas the first diameter 211 may be adapted to an input coaxial system.

The second axial section 220 may include a spring which will be explained in more detail later. This second section may have an inner space 222 with contact springs 221 which may further be adapted to the diameter of the conductive rod.

The second axial section is followed by a third axial section 230 which has a straight bore 231 with a diameter adapted to the diameter of the conductive rod, such that the conductive rod may slide through this section along the center axis 280.

Figure 3:
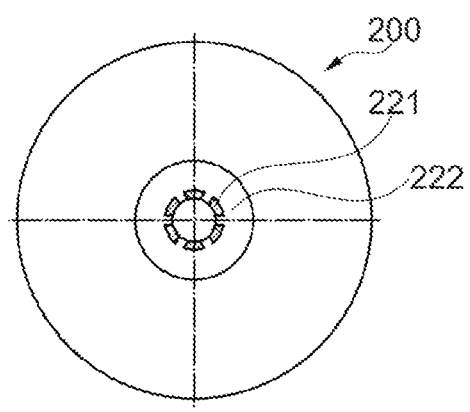
FIG. 3 is a cross-sectional view through the spring section.

In FIG. 3, a cross-sectional view through the spring section 220 is shown. At the center are individual contact springs 221.

Figure 4:
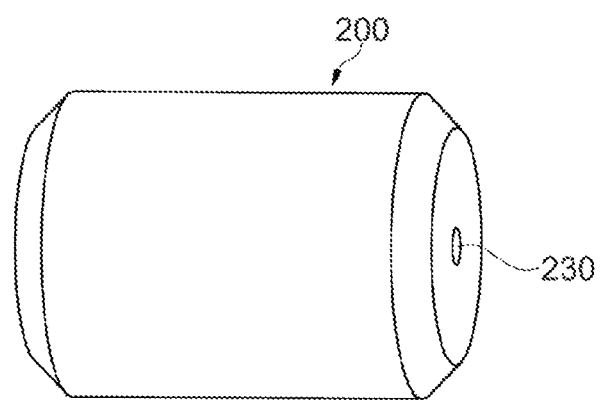
FIG. 4 is a total view of the coaxial support.

In FIG. 4, a total view of the coaxial support is shown.

Figure 5:
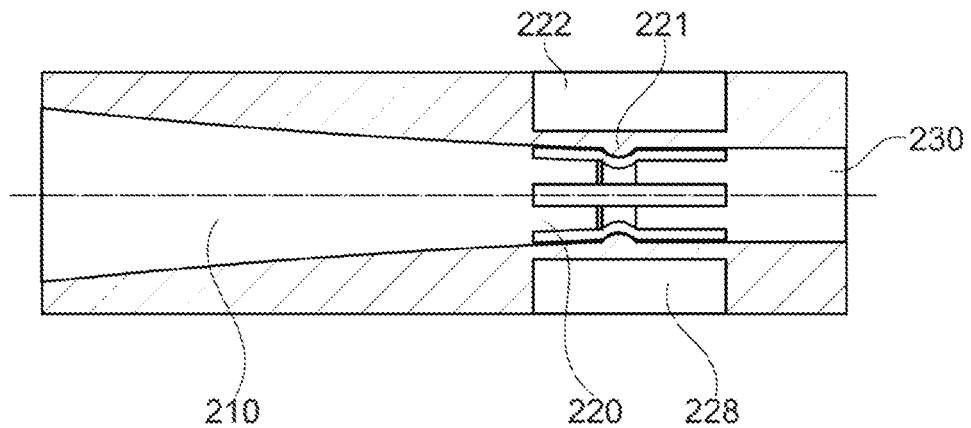
FIG. 5 shows a detail of the spring section.

In FIG. 5, a detail of the spring section is shown. The springs 221 may include elongated pieces of material which may flex when receiving a radial force, e.g., from the conductive rod. The springs 221 may also include contact protrusions 223 which improve contact and generate a higher point pressure on the surface of the conductive rod.

Figure 6:
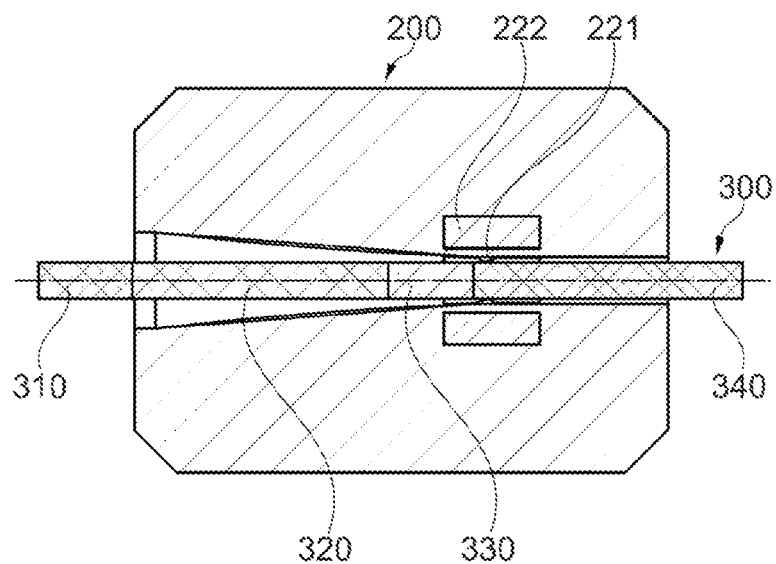
FIG. 6 is a sectional view of the coaxial support together with a conductive rod.

FIG. 6 shows a sectional view of the coaxial support together with a conductive rod, here a possible alignment between the conductive rod and the coaxial support is shown. The second high conductive zone 340 at the second end may be aligned with the contact springs 221 of the second section 220. The first resistive zone 320 and the second resistive zone 330 may be within the exponential funnel and the first load impedance conductive zone 310 may be outside of the exponential funnel and outside of the coaxial support for contacting an external device or a center conductor 144.

Figure 7:
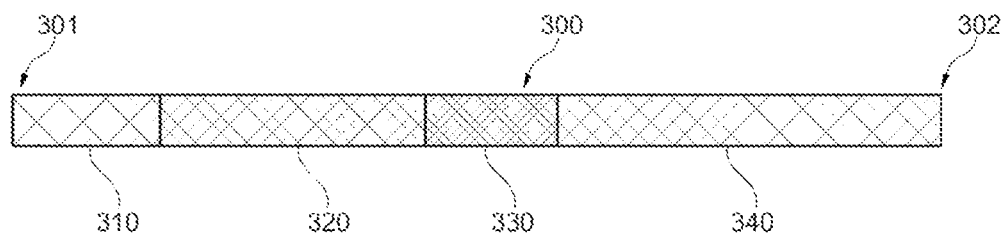
FIG. 7 shows details of the conductive rod.

FIG. 7 shows details of the conductive rod. The conductive rod may include at least two conductive sections at its ends and resistive sections in between, whereas neighboring sections are connected to each other. At a first end 301, there may be a first conductive section having a low impedance 310. This may be followed by a first resistive zone 320 which may have a constant resistance over length or a variable resistance over length. This resistance may be adjusted by laser cutting or by adjusting the layer thickness which may e.g., be generated by a sputtering process. Following this zone, there may be a second resistive zone 330 which may have different resistance. This is followed by a second high conductive zone 340 close to the second end 302 of the conductive rod. This second conductive zone may be in contact with the contact springs 221 of the second section of the coaxial support 200.

Figure 8:
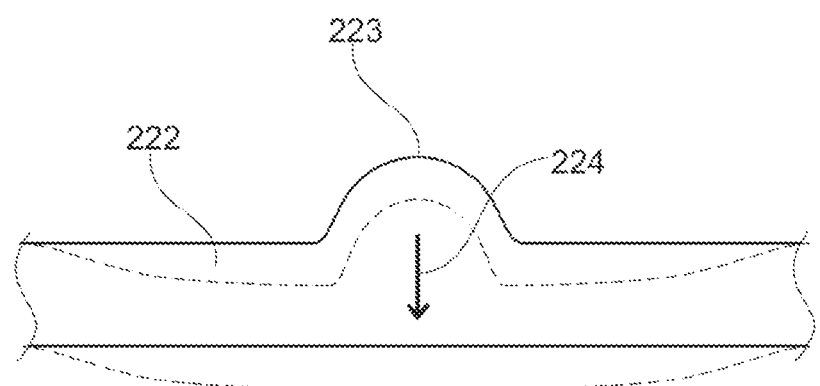
FIG. 8 is a sectional view of a contact spring.

FIG. 8 shows a sectional view of a contact spring. The contact spring 221 has a contact protrusion 223 which presses against the conductive rod. When the rod is inserted, the contact protrusion is displaced outwards in the direction of arrow 224 as shown by dashed lines.

Figure 9:
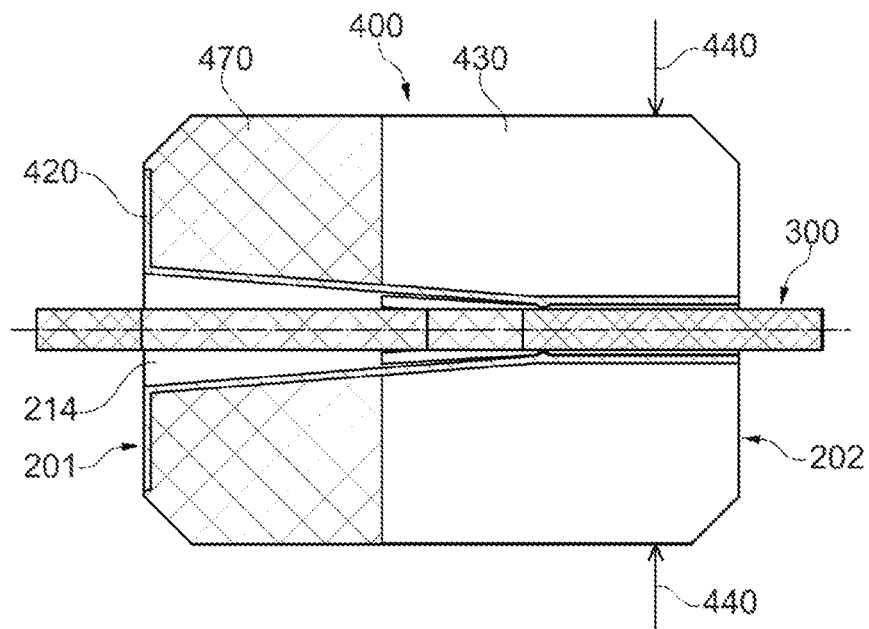
FIG. 9 is a sectional view of a second embodiment of a coaxial support.

FIG. 9 is a sectional view of a second embodiment of a coaxial support 400. A body 470 may include at least one slot 430 in the region of the contact protrusions and/or at the second side 202. The at least one slot 430 may basically extend in a radial direction from the outer surface of the coaxial support. The embodiment may work best if there exist 2, 3, 4, 5 or 6 slots, which may be equally spaced angularly. The embodiment shown in the figure has 4 slots 430. This embodiment may work like a collet. By radially compressing the body by applying a radial force 440, the diameter of the second section 220 may be reduced such to assert or increase a force to the conductive rod. Such radial force may be applied by pressing the body into a conical section of an outer conductor 154 or shell 152. Instead, a nut with a conical thread either in the nut or on the body may be provided.

There may be a metal insert 420 which may include sheet metal or a metal film. The metal insert may also be a metal tube. The metal insert may at least cover the surface of the first section 210 of body 470 including exponential funnel 214 and optionally the second section 220 and/or third section 230. Such a metal insert may provide a smooth inner surface oriented towards the conductive rod, further providing an optimized broad band return loss. Due to the metal insert, deviations in shape of the body like burrs may have no effect.

Figure 10:
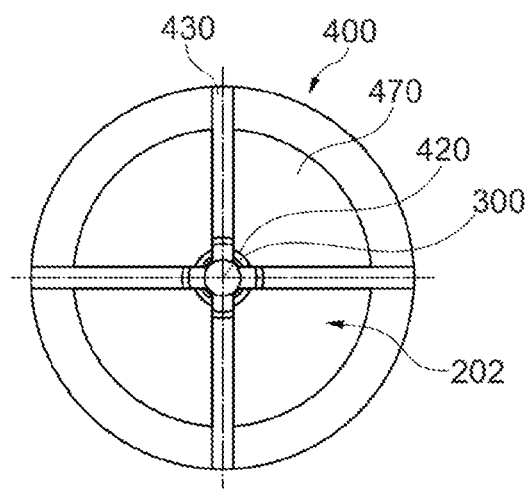
FIG. 10 is a view from the second side of the second embodiment.

FIG. 10 is a view from the second side 202 of the second embodiment of a coaxial support.

Figure 11:
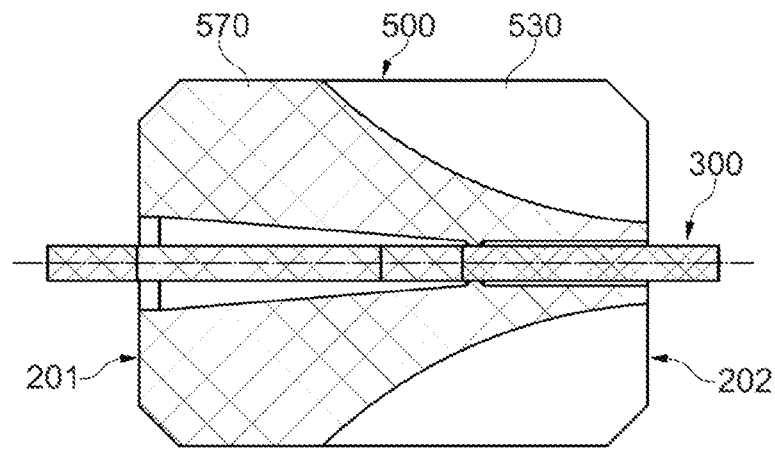
FIG. 11 is a sectional view of a third embodiment of a coaxial support.

FIG. 11 is a sectional view of a third embodiment of a coaxial support. The body 570 has a plurality of slots 530 similar to the previous embodiment. Here the body 570 may include a metal.

Figure 12:
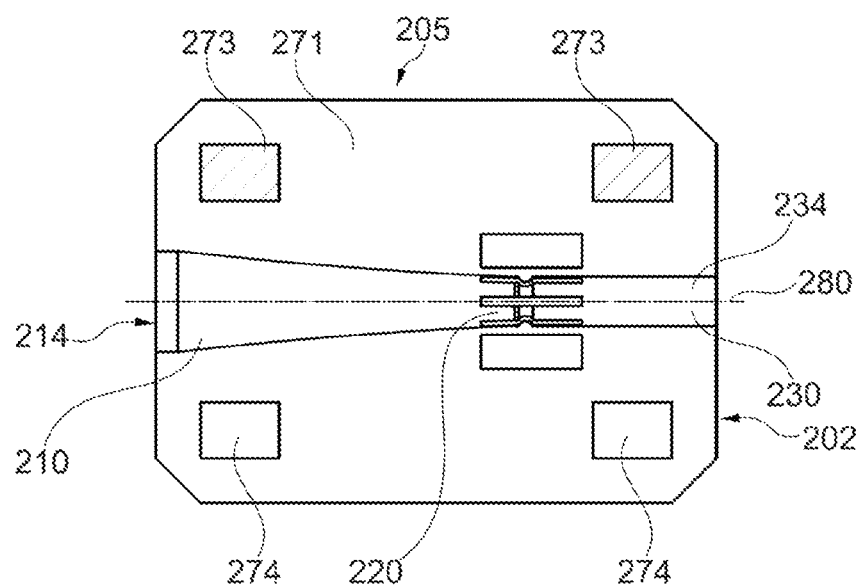
FIG. 12 is a sectional view of a modified embodiment.

FIG. 12 shows a modified embodiment based on FIG. 3. Here, the coaxial support 205 is split into at least two body parts, a first body part 271 and a second body part 272. The parts may be split in a plane through center axis 280. This allows a simplified manufacturing process, specifically, if manufactured by a 3D printing process. There may be protrusions 273 and recesses 274 matching together to connect the first body part 271 with the second body part 272. The body parts may be identical, such that each body part includes protrusions 273 and recesses 274.

Figure 13:
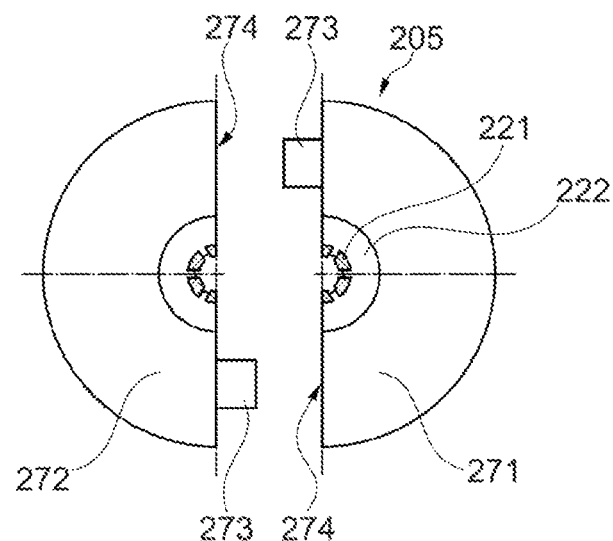
FIG. 13 is a front view of body parts.

FIG. 13 is a front view of the body parts. It shows that the second body part 272 is the same as the first body part 271 but rotated about 180° around the center axis.

Figure 14:
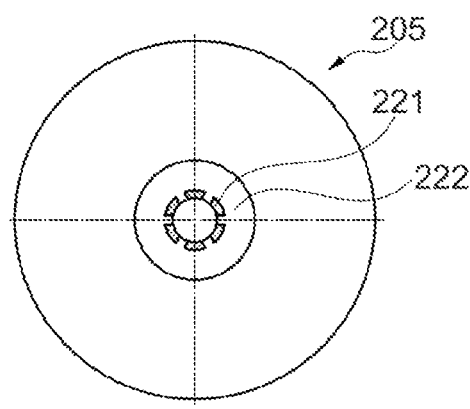
FIG. 14 is a front view of a modified embodiment.

FIG. 14 is a front view of a modified embodiment. Here, the first body part 271 with the second body part 272 are connected together to form a single body. There may be at least one or a combination of a snap connection, a press fit, a glued connection or a welded connection.

It will be appreciated by those skilled in the art who have the benefit of this disclosure that this invention provides a broad band coaxial load. Further modifications and alternative embodiments of various aspects of the invention will be apparent to those skilled in the art in view of this description. Accordingly, this description is to be construed as illustrative only and is provided for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

LIST OF REFERENCE NUMERALS 100 broad band coaxial load
105 center axis
113 first end
114 second end
144 center conductor
145 spacer
150 load housing
152 shell
154 outer conductor
155 inner diameter of outer conductor
159 hollow space
200 coaxial support
201 first side
202 second side
205 first part
210 first section
211 first diameter of exponential funnel at outer end
212 second diameter of exponential funnel at inner end
214 exponential funnel
220 second section
221 contact springs
222 inner space
223 contact protrusion
224 displacement of contact protrusion
230 third section
231 diameter of third section
234 cylindrical hole
270 body
271 first body part
272 second body part
273 protrusion
274 recess
280 center axis
300 conductive rod
301 first end
302 second end
310 high conductive zone at first end
320 first resistive zone
330 second resistive zone
340 high conductive zone at second end
400 second embodiment of coaxial support
420 metal insert
430 slot
440 radial force
470 body
500 third embodiment of coaxial support
530 slot
570 body

The invention claimed is:

1. A broad band coaxial load comprising a conductive rod held coaxially within a coaxial support, the coaxial support having a body that includes a round hole with three axial sections, wherein:
   a first section comprises a funnel starting from a first side of the coaxial support and having a first section diameter that is equal to a first diameter at an end of the funnel and that decreases in a direction into the coaxial support to a second diameter, the second diameter matching a diameter of the conductive rod,
   a second section comprising a plurality of radially oriented contact springs, said plurality having a diameter matching the diameter of the conductive rod,
   a third section comprising a cylindrical hole with a third section diameter matching the diameter of the conductive rod,
   wherein the conductive rod comprises, in an axial direction between a first end thereof and an opposing second end thereof:
   a first high conductive zone at the first end,
   a first resistive zone following and connected to the first high conductive zone, and
   a second high conductive zone at the second end, connected to a zone preceding the second high conductive zone and separated from the first high conductive zone by the first resistive zone.

2. A broad band coaxial load according to claim 1, further comprising:
   an outer conductor with a coaxial center conductor, and
   a shell configured to hold the coaxial support together with the conductive rod and the outer conductor with the coaxial center conductor,
   wherein the outer conductor contacts the coaxial support and the center conductor is connected to the conductive rod.

3. A broad band coaxial load according to claim 1, further comprising
   at least three contact springs.

4. A broad band coaxial load according to claim 1, wherein the conductive rod includes a rod having an at least partially conductive surface or a metal rod.

5. A broad band coaxial load according to claim 1, wherein
   the first high conductive zone at the first end is oriented to the first side of the coaxial support.

6. A broad band coaxial load according to claim 1, wherein an end of the conductive rod protrudes from the second side of the coaxial support.

7. A broad band coaxial load according to claim 1, wherein an end of the conductive rod is glued to the second side of the coaxial support.

8. A broad band coaxial load according to claim 1, wherein the hole in the body of the coaxial support has an axial length of at least 3 times the third section diameter.

9. A broad band coaxial load according to claim 1, wherein the coaxial support and the contact springs form a monolithic part.

10. A broad band coaxial load according to claim 1, wherein the coaxial support comprises a polymer material and/or a metal.

11. A broad band coaxial load according to claim 1, wherein the coaxial support has a conductive surface located at least at the first section of the coaxial support having the funnel and at the second section comprising the contact springs.

12. A broad band coaxial load according to claim 1, wherein the funnel includes at least one of a linear funnel, a curved funnel, a circular funnel, a hyperbolic funnel, and an exponential funnel.

13. A broad band coaxial load according to claim 1, wherein the body comprises at least a first part and a second part, wherein at least one of the first part and the second part has a protrusion geometrically matching a recess at the other of the first and second parts to connect the first part to the second part.

14. A broad band coaxial load according to claim 1, further comprising
   a load housing enclosing a hollow space at the second side of the coaxial support.

15. A broad band coaxial load according to claim 3, wherein the at least three contact springs are evenly angularly spaced.

16. A broad band coaxial load according to claim 1, further comprising:
   a second resistive zone following and connected to the first resistive zone.

17. A broad band coaxial load according to claim 11, wherein the conductive surface of the coaxial support comprises a surface of a metallic layer.

18. A broad band coaxial load according to claim 13, wherein the first part and the second part are identical to one another.

19. A broad band coaxial load comprising a conductive rod held coaxially within a coaxial support, the coaxial support having a body that includes a round hole with three axial sections,
   wherein:
      a first section comprises a funnel starting from a first side of the coaxial support and having a first section diameter that is equal to a first diameter at an end of the funnel and that decreases in a direction into the coaxial support to a second diameter, the second diameter matching a diameter of the conductive rod,
      a second section comprising a plurality of radially oriented contact springs, said plurality having a diameter matching the diameter of the conductive rod, and
      a third section comprising a cylindrical hole with a third section diameter matching the diameter of the conductive rod,
   wherein the broad band coaxial load further comprises:
      an outer conductor with a coaxial center conductor, and
      a shell configured to hold the coaxial support together with the conductive rod and the outer conductor with the coaxial center conductor,
      wherein the outer conductor contacts the coaxial support and the center conductor is connected to the conductive rod.

* * * * *